(12) United States Patent
Sawairi et al.

(10) Patent No.: US 12,100,907 B2
(45) Date of Patent: Sep. 24, 2024

(54) BOARD MOUNT CONNECTOR AND CONNECTOR-MOUNTED BOARD

(71) Applicant: YAZAKI CORPORATION, Tokyo (JP)

(72) Inventors: Kaoru Sawairi, Makinohara (JP); Naokazu Nagasaka, Makinohara (JP); Naoki Takamura, Makinohara (JP); Kotarou Wada, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 323 days.

(21) Appl. No.: 17/714,127

(22) Filed: Apr. 5, 2022

(65) Prior Publication Data

US 2022/0328991 A1  Oct. 13, 2022

(30) Foreign Application Priority Data

Apr. 7, 2021 (JP) .................................. 2021-065459

(51) Int. Cl.
*H01R 12/72* (2011.01)
*H01R 12/70* (2011.01)

(52) U.S. Cl.
CPC ....... *H01R 12/727* (2013.01); *H01R 12/7064* (2013.01)

(58) Field of Classification Search
CPC .......................... H01R 12/727; H01R 12/7064
USPC .......................................................... 439/79
See application file for complete search history.

(56) References Cited

U.S. PATENT DOCUMENTS

| | | | | |
|---|---|---|---|---|
| 5,547,384 A | * | 8/1996 | Benjamin | ............ H01R 12/707 439/83 |
| 6,155,873 A | * | 12/2000 | Chang | ................ H01R 12/7029 439/541.5 |
| 6,165,028 A | * | 12/2000 | Hirai | .................... H01R 12/725 439/857 |
| 6,491,536 B1 | * | 12/2002 | Torii | ...................... H01R 12/58 439/246 |

(Continued)

FOREIGN PATENT DOCUMENTS

| | | |
|---|---|---|
| EP | 3487013 A1 | 5/2019 |
| JP | 2019-21544 A | 2/2019 |

(Continued)

*Primary Examiner* — Gary F Paumen
(74) *Attorney, Agent, or Firm* — KENEALY VAIDYA LLP (57) ABSTRACT

A board mount connector includes: a housing having a press-fitting hole; and a terminal press-fitted into the press-fitting hole. The terminal includes: a first terminal portion including a first contact portion contacting and conductively connected to the counterpart terminal when the first contact portion is connected to the counterpart terminal, and a press-fitting portion that is press-fitted into the press-fitting hole; and a second terminal portion including a bent portion extending from the first terminal portion and bent around a bending axis along an axis line of the first terminal portion, and a second contact portion located at a position offset from the first contact portion in an intersecting direction intersecting the axis line of the first terminal portion and conductively connected to the conductor pattern when the boar mount connector is mounted on the circuit board.

3 Claims, 10 Drawing Sheets

(56) References Cited

U.S. PATENT DOCUMENTS

| | | | |
|---|---|---|---|
| 7,341,462 B2 * | 3/2008 | Matsuoka | H01R 43/16 439/931 |
| 2006/0234530 A1 * | 10/2006 | Chung | H05K 3/341 439/79 |
| 2019/0148884 A1 * | 5/2019 | Sugiki | H01R 12/91 439/247 |

FOREIGN PATENT DOCUMENTS

| | | |
|---|---|---|
| JP | 2019-91649 A | 6/2019 |
| JP | 2020-187953 A | 11/2020 |
| JP | 2021-157883 A | 10/2021 |

* cited by examiner

BOARD MOUNT CONNECTOR AND CONNECTOR-MOUNTED BOARD

CROSS-REFERENCE TO RELATED APPLICATIONS

This application is based on and claims the benefit of priority of Japanese Patent Application No. 2021-065459 filed on Apr. 7, 2021, the entire contents of which are incorporated herein by reference.

FIELD

The present disclosure relates to a board mount connector that has a structure in which a terminal is press-fitted and held in a housing and is to be mounted on a circuit board, and a connector-mounted board in which the connector is mounted on the circuit board.

BACKGROUND

As an example of a board mount connector, JP-A-2020-187953 discloses a connector in which a terminal is press-fitted into a press-fitting hole provided in a housing, one end portion of the terminal is used as a contact portion (so-called tab) with a counterpart terminal, and the other end portion of the terminal is used as a contact portion with a conductor pattern on a circuit board. The terminal used in this type of connector is generally manufactured through punching, press working, and the like of a thin metal plate.

SUMMARY

Since the board mount connector is mounted such that the connector is attached to a board surface or a board edge of the circuit board, in general, a contact portion with a counterpart terminal of a terminal and a contact portion with a conductor pattern of the circuit board are located at positions offset in a thickness direction of the circuit board. Therefore, in a process of manufacturing the terminal, the terminal is subjected to bending processing such that both ends of the terminal are offset from each other. For example, when manufacturing a typical crank-shaped terminal used in the connector described above, it is necessary to perform the bending processing for bending at least two positions of the terminal. From a viewpoint of improving productivity of the terminal (as a result, the productivity of the connector), it is desirable to perform the bending processing in the process of manufacturing the terminal as efficiently as possible.

An object of the present disclosure is to provide a board mount connector having excellent productivity, and a connector-mounted board using the connector.

The present disclosure provides a board mount connector mountable on a circuit board having a conductor pattern and connectable to a counterpart terminal, the board mount connector including: a housing having a press-fitting hole; and a terminal press-fitted into the press-fitting hole, wherein the terminal includes: a first terminal portion; and a second terminal portion, wherein the first terminal portion includes: a first contact portion contacting and conductively connected to the counterpart terminal when the first contact portion is connected to the counterpart terminal; and a press-fitting portion that is press-fitted into the press-fitting hole, and wherein the second terminal portion includes: a bent portion extending from the first terminal portion and bent around a bending axis along an axis line of the first terminal portion; and a second contact portion located at a position offset from the first contact portion in an intersecting direction intersecting the axis line of the first terminal portion and conductively connected to the conductor pattern when the boar mount connector is mounted on the circuit board.

The present disclosure provides a connector-mounted board including: a circuit board; and the above-described board mount connector mounted on the circuit board, wherein the circuit board has a cut portion defined by a side edge of the circuit board that is recessed in a direction along a board surface, and wherein the board mount connector is disposed such that the housing is fitted into the cut portion, and the second terminal portion is conductively connected to the conductor pattern of the circuit board.

The present disclosure has been briefly described above. Further, details of the present disclosure will be clarified by reading an aspect (hereinafter, referred to as an "embodiment") for implementing the invention to be described below with reference to the accompanying drawings.

BRIEF DESCRIPTION OF DRAWINGS

FIGS. 1A and 1B show a state in which a board mount connector according to an embodiment of the present disclosure is mounted on a circuit board, FIG. 1A is a perspective view as viewed from a front side, and FIG. 1B is a perspective view as viewed from a back side.

FIG. 3A to 3C show the connector and the circuit board shown in FIGS. 1A and 1B, FIG. 3A is a top view thereof, FIG. 3B is a front view thereof, and FIG. 3C is a rear view thereof.

FIGS. 6A and 6B show an upper terminal, FIG. 6A is a top view thereof, and FIG. 6B is a side view thereof.

FIGS. 7A and 7B show a lower terminal, FIG. 7A is a top view thereof, and FIG. 7B is a side view thereof.

FIGS. 8A and 8B show a chain terminal that is obtained by punching out a thin metal plate and in which a plurality of preform bodies are connected by carriers, FIG. 8A is a top view thereof, and FIG. 8B is an enlarged view of a part of a cross section taken alone a line C-C of FIG. 8A.

DETAILED DESCRIPTION

Embodiment

Figures 1A, 1B:
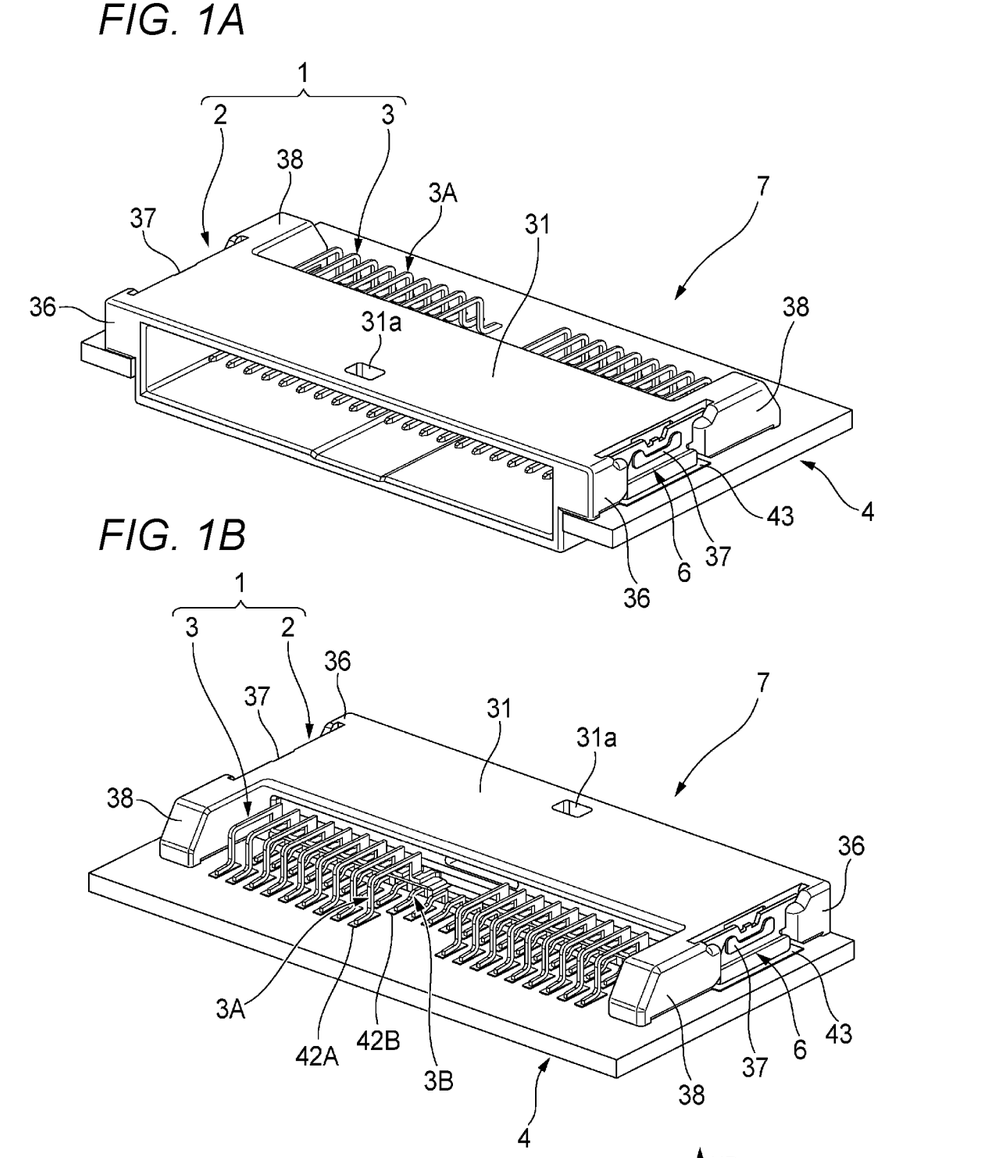

Hereinafter, a board mount connector 1 and a connector-mounted board 7 according to an embodiment of the present disclosure will be described with reference to the drawings. As shown in FIGS. 1A and 1B, a connector 1 includes a housing 2 and a plurality of terminals 3 press-fitted into the housing 2, and is used by being mounted on a circuit board 4. With this mounting, the connector-mounted board 7 is manufactured.

Hereinafter, for convenience of description, as shown in FIGS. 1A to 10, a "front-rear direction", a "left-right direction", an "up-down direction", "front", "rear", "left", "right", "up (upper)", and "down (lower)" are defined. The "front-rear direction", the "left-right direction", and the "up-down direction" are orthogonal to one another. The front-rear direction coincides with a fitting direction of the connector 1 and a counterpart connector (not shown), a front side in the fitting direction in which the counterpart connector is fitted is referred to as a front side, and a rear side in the fitting direction opposite to the front side is referred to as a rear side. The left-right direction coincides with an arrangement direction in which a plurality of upper press-fitting holes 33A and a plurality of lower press-fitting holes 33B (see FIG. 5 and the like), which will be described later, of the housing 2 are disposed. Hereinafter, each member constituting the connector 1 will be described in order.

Figure 5:
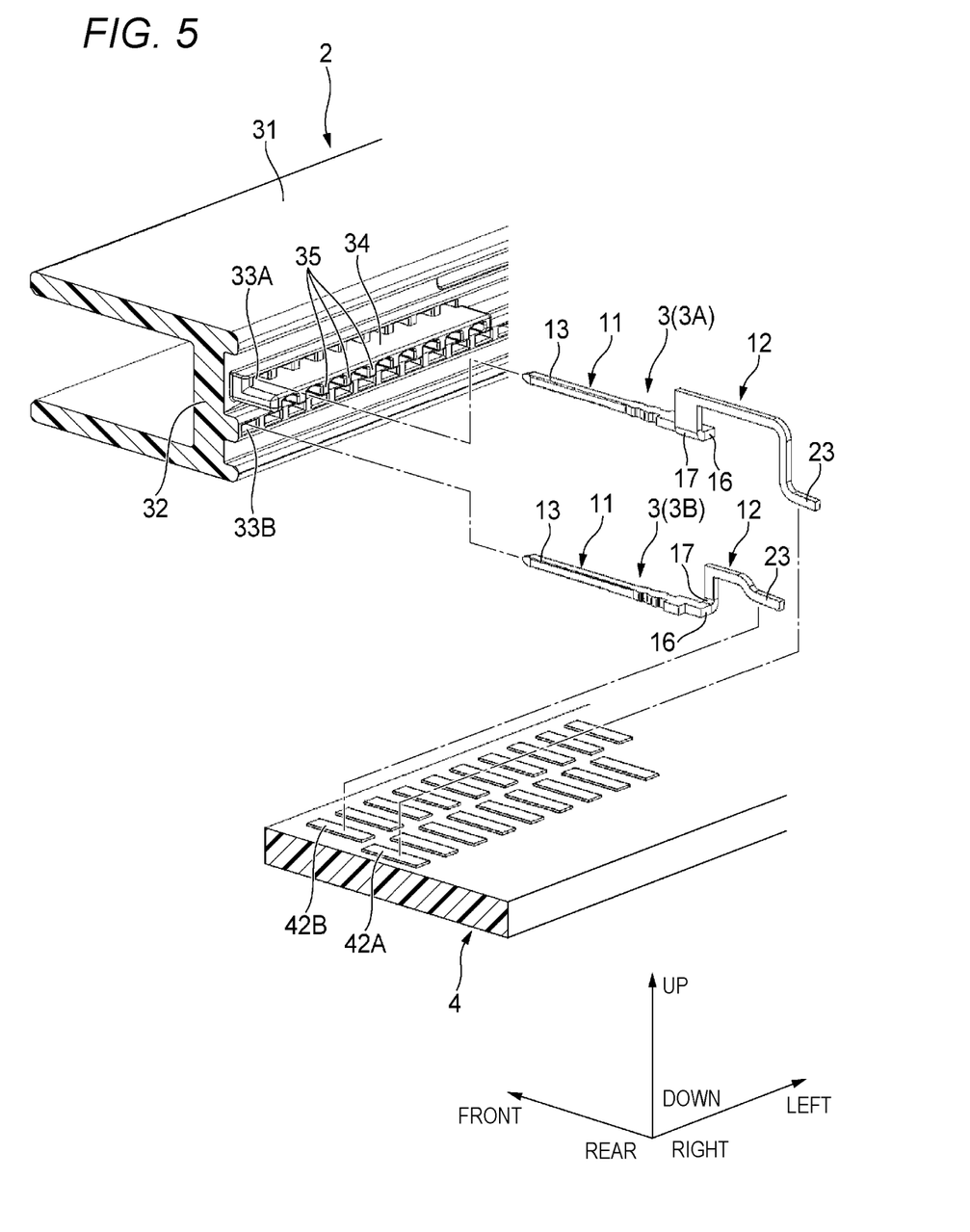
FIG. 5 is a view corresponding to FIG. 4 showing an assembly procedure of a housing, a terminal, and the circuit board.

First, the terminals 3 will be described. As shown in FIG. 5 and the like, the connector 1 includes, as the plurality of terminals 3, a plurality of upper terminals 3A to be press-fitted into the upper press-fitting holes 33A and a plurality of lower terminals 3B to be press-fitted into the lower press-fitting holes 33B. First, the upper terminals 3A will be described.

Figure 6A:
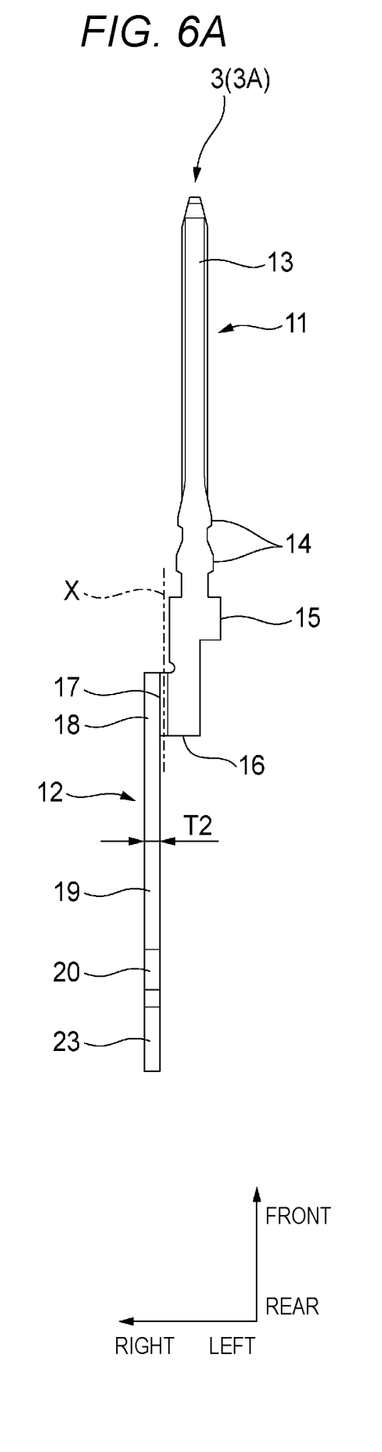
Figure 6B:
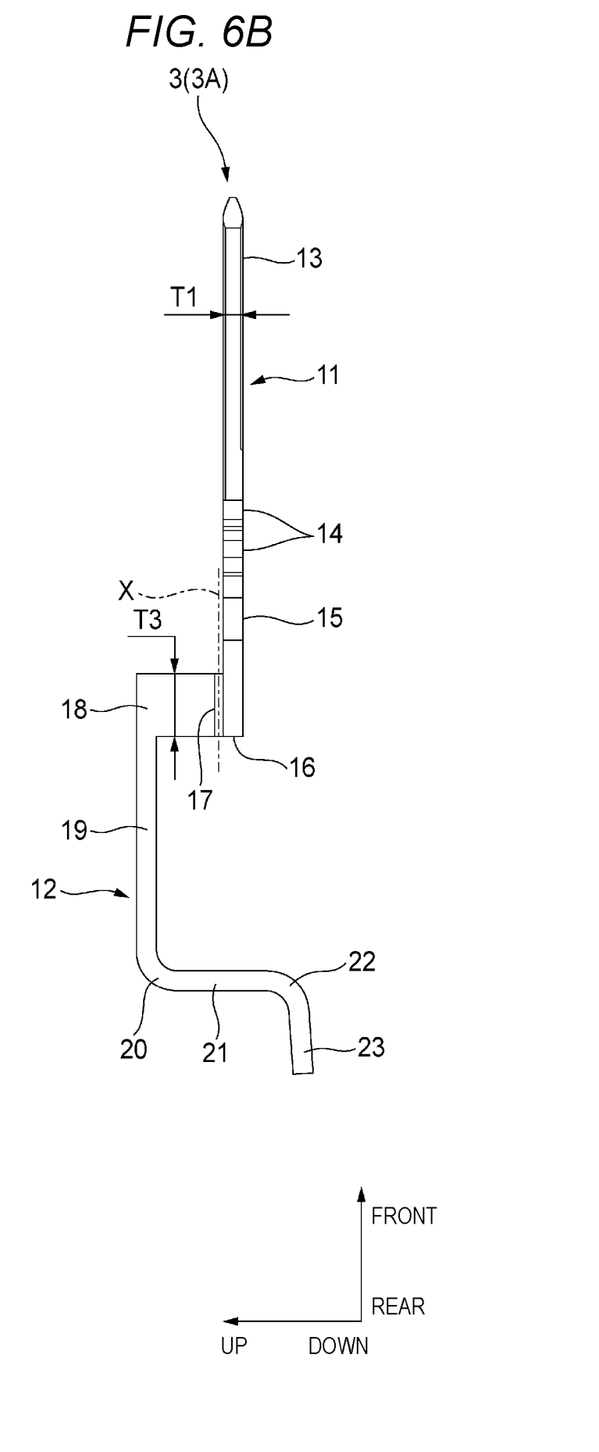

The upper terminal 3A shown in FIGS. 6A and 6B is formed by performing bending processing on bent portions 17, 20, and 22 (see FIGS. 6A and 6B) with respect to a preform body 3g (see FIGS. 8A and 8B) obtained by punching and pressing a flat-shaped thin metal plate. The preform body 3g includes a first terminal portion 11 extending linearly and a second terminal portion 12 extending in a substantially L-shape. Each of the first terminal portion 11 and the second terminal portion 12 has a rectangular cross section orthogonal to an extending direction.

As shown in FIGS. 6A and 6B, the first terminal portion 11 has a shape linearly extending in the front-rear direction as a whole. A front end portion of the first terminal portion 11 functions as a first contact portion 13 that comes into contact with and is conductively connected to a counterpart terminal (female terminal, not shown) accommodated in the counterpart connector. A pair of press-fitting projections 14 projecting in both left and right directions are provided at two positions in the front-rear direction at positions on a rear side of the first contact portion 13 of the first terminal portion 11.

A wide portion 15 is provided at a position of the first terminal portion 11 on a rear side of the press-fitting projections 14 so as to project further in both the left and right directions than the pair of press-fitting projections 14. The wide portion 15 functions as a stopper that defines a position of the upper terminal 3A in the front-rear direction with respect to the housing 2 when the upper terminal 3A is press-fitted. A rear end surface (a rectangular flat surface orthogonal to the front-rear direction) of the first terminal portion 11 functions as a pressing surface 16 for pressing a press-fitting jig (not shown) when the upper terminal 3A is press-fitted. Therefore, since a press-fitting jig can be pressed against a pressing surface 16 positioned on an extension line of an axis line of the first contact portion 13, a structure of the terminal 3 can be simplified as compared to a case in which a dedicated pressing surface (for example, a so-called shoulder portion) is separately provided in the terminal 3. Further, a problem such as buckling is less likely to occur in the first terminal portion 11 at the time of press-fitting.

As shown in FIGS. 6A and 6B, the second terminal portion 12 includes the bent portion 17 extending rightward from a rear end portion (a portion on a rear side of the wide portion 15) of the first terminal portion 11 and bent upward, a standing portion 18 extending upward from an upper end portion of the bent portion 17, a first portion 19 extending rearward from an upper end portion of the standing portion 18, the bent portion 20 extending rearward from a rear end portion of the first portion 19 and bent downward, a second portion 21 extending downward from a lower end portion of the bent portion 20, the bent portion 22 extending downward from a lower end portion of the second portion 21 and bent rearward, and a second contact portion 23 extending rearward from a rear end portion of the bent portion 22. The second contact portion 23 is conductively connected to a conductor pattern 42A of the circuit board 4 (see FIGS. 4 and 5). The bent portion 17 is bent around a bending axis X offset in parallel to a right side from the axis line of the first terminal portion 11.

As described above, in the upper terminal 3A, the second terminal portion 12 is located at a position offset rightward with respect to the first terminal portion 11 (see FIG. 6A). Further, the second contact portion 23 is located at a position offset downward with respect to the first contact portion 13 (see FIG. 6B).

In the upper terminal 3A, a crank shape (see FIG. 6B) formed by the first terminal portion 11, the standing portion 18, and the first portion 19 when viewed in the left-right direction can be obtained by performing bending processing once on the bent portion 17. Therefore, the number of times bending processing is performed on the terminal in order to obtain the crank shape can be reduced as compared to a general machining method in which two positions of the terminal in the extending direction are bent to obtain the crank shape.

Figure 8A:
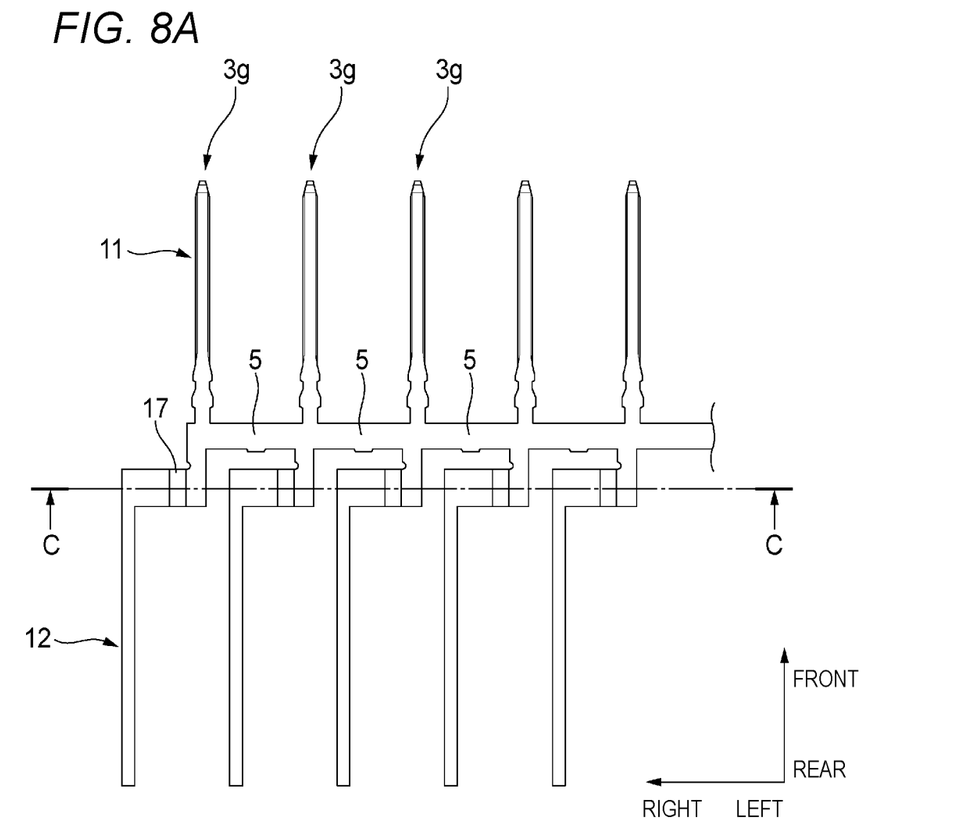
Figure 8B:
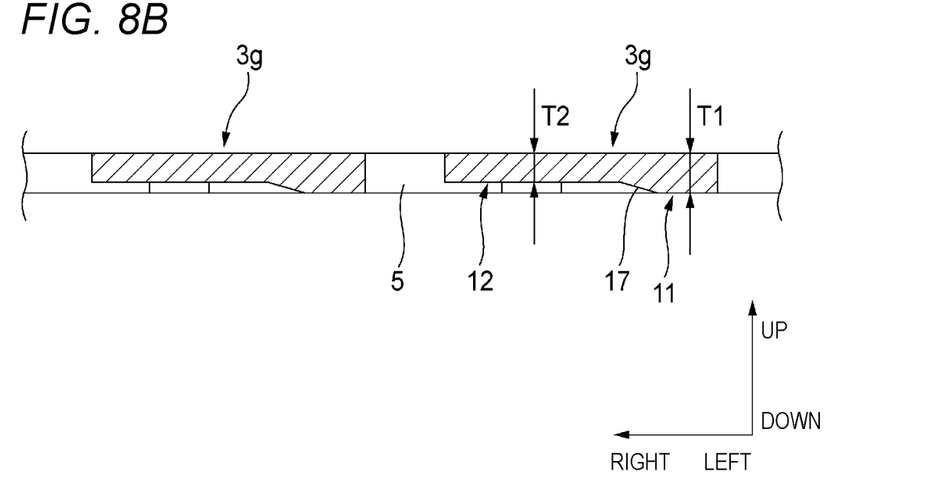
Figure 9A:
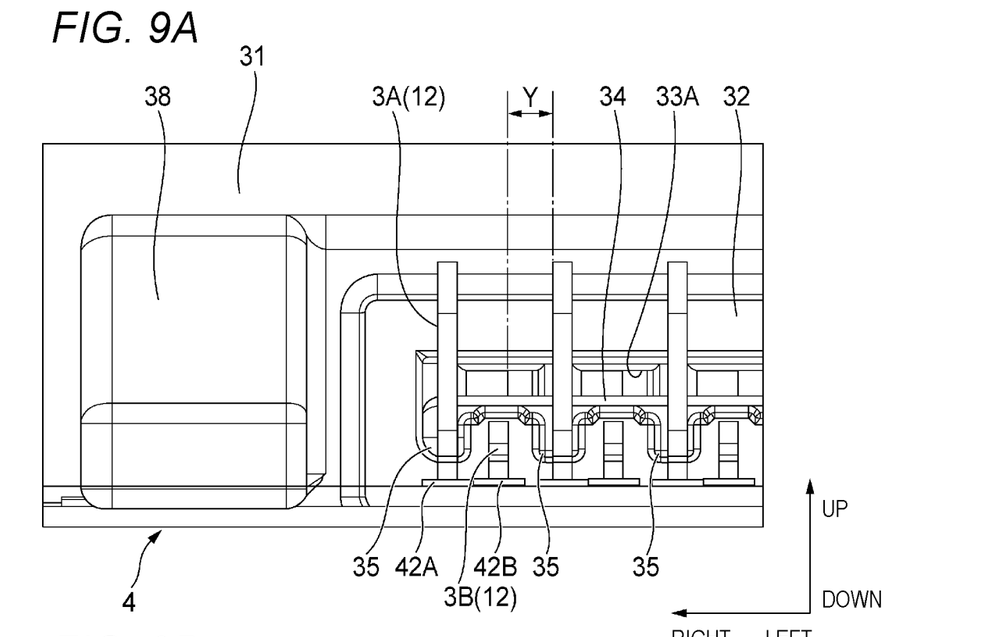
FIG. 9A is an enlarged view of a portion B in FIG. 3C.
Figure 9B:
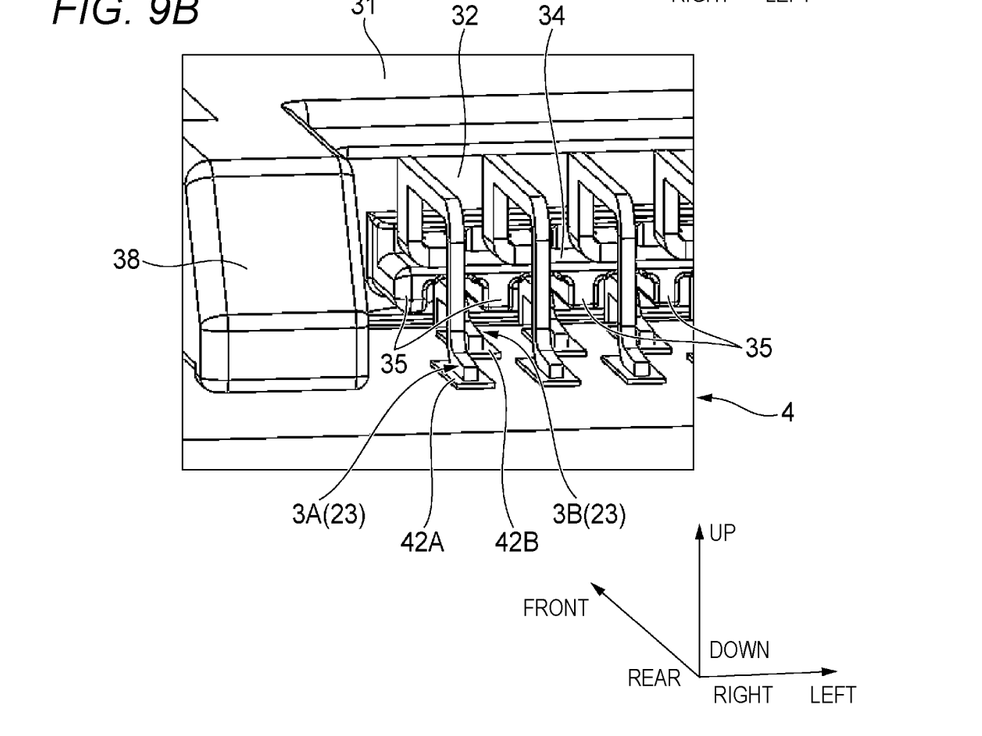
FIG. 9B is an enlarged perspective view of the portion B in FIG. 3C.

In the upper terminal 3A, a plate thickness T2 (see FIG. 6A) of the second terminal portion 12 is smaller than a plate thickness T1 (see FIG. 6B) of the first terminal portion 11 (see also FIG. 8B). More specifically, the plate thickness T2 of the second terminal portion 12 is smaller than the plate thickness T1 of the first terminal portion 11 because the second terminal portion 12 has a shape in which the thickness is reduced in a direction in which a bent outer surface (a lower surface in FIG. 8B) at the curved portion 17 approaches a bent inner surface (an upper surface in FIG. 8B). Therefore, it is easy to perform the bending processing when the bent portion 17 of the second terminal portion 12 is provided. Further, in the present example, the plurality of upper terminals 3A are disposed in the housing 2 in a state of being disposed in the left-right direction (see FIG. 4 and the like). In this case, among the upper terminals 3A adjacent to each other in the left-right direction, the bent portion 17 of the left upper terminal 3A and a left end surface of a rear end portion of the first terminal portion 11 of the right upper terminal 3A are closest to each other in the left-right direction (see FIG. 9B). In this regard, since the plate thickness T2 (that is, the thickness in the left-right direction) of the bent portion 17 (a part of the second terminal portion 12) is reduced in a direction away from the adjacent first terminal portion 11, an interval Y (so-called insulation distance) in the left-right direction between the bent portion 17 and the adjacent first terminal portion 11 can be improved.

In the upper terminal 3A, a width T3 (see FIG. 6B) of the bent portion 17 and the standing portion 18 in the front-rear direction is larger than the plate thickness T1 and the plate thickness T2. Therefore, rigidity of the bent portion 17 can be increased, and the shape of the upper terminal 3A after the bending processing on the bent portion 17 is appropriately maintained. As a result, coplanarity (flatness) of the second contact portion s 23 of the plurality of upper terminals 3A is increased, and thus reliability of the electrical connection between the circuit board 4 and the connector 1 is improved. The upper terminal 3A has been described above.

The upper terminal 3A described above is manufactured, for example, as follows. First, the thin metal plate is punched out to obtain, as shown in FIG. 8A, a chain terminal in which a plurality of preform bodies 3g are connected by carriers 5. Next, in the chain terminal, only the second terminal portion 12 of each of the preform bodies 3g is sequentially subjected to the press working, and for each of the preform bodies 3g, the plate thickness T2 of the second terminal portion 12 is made smaller than the plate thickness T1 of the first terminal portion 11 (see also FIG. 8B). Next, in the chain terminal, the carriers 5 are removed to separate the plurality of preform bodies 3g from each other, and the bending processing is performed on the bent portions 17, 20, and 22 (see FIGS. 6A and 6B) of each of the perform bodies 3g. Accordingly, the plurality of upper terminals 3A are obtained. The bending processing on the a part or all of the bent portions 17, 20, and 22 (see FIGS. 6A and 6B) may be performed before or after the upper terminal 3A is press-fitted into the housing 2.

As can be understood from the manufacturing procedure described above, at the second contact portion 23 of the upper terminal 3A, a punched surface (cut surface) generated when the thin metal plate is punched out faces and is connected to conductor patterns 42A and 42B of the circuit board 4. From a viewpoint of achieving good electrical connection, in the present example, the punched surface of the second contact portion 23 is subjected to plating processing. Examples of a plating material include gold (Au). Gold plating is generally provided on a base plating such as copper or nickel after the base plating is provided on a base material. Not only the punched surface of the second contact portion 23 but also the entire punched surface of the upper terminal 3A may be subjected to the same plating processing. In the present example, the second contact portion 23 of the lower terminal 3B, which will be described later, is also subjected to the same plating processing.

Next, the lower terminal 3B will be described. In the lower terminal 3B shown in FIGS. 7A and 7B, the same or equivalent configuration as the configuration of the upper terminal 3A shown in FIGS. 6A and 6B is denoted by the same reference numeral as the reference numeral given to the upper terminal 3A, and the description thereof is omitted. The second contact portion 23 of the lower terminal 3B is conductively connected to the conductor pattern 42B of the circuit board 4 (see FIGS. 4 and 5). The lower terminal 3B is also manufactured from the chain terminal as shown in FIG. 8A through the same processing as that of the upper terminal 3A. The lower terminal 3B also has the same functions and effects as the above-described various functions and effects of the upper terminal 3A. Hereinafter, main differences between the lower terminal 3B and the upper terminal 3A will be described.

Figure 7A:
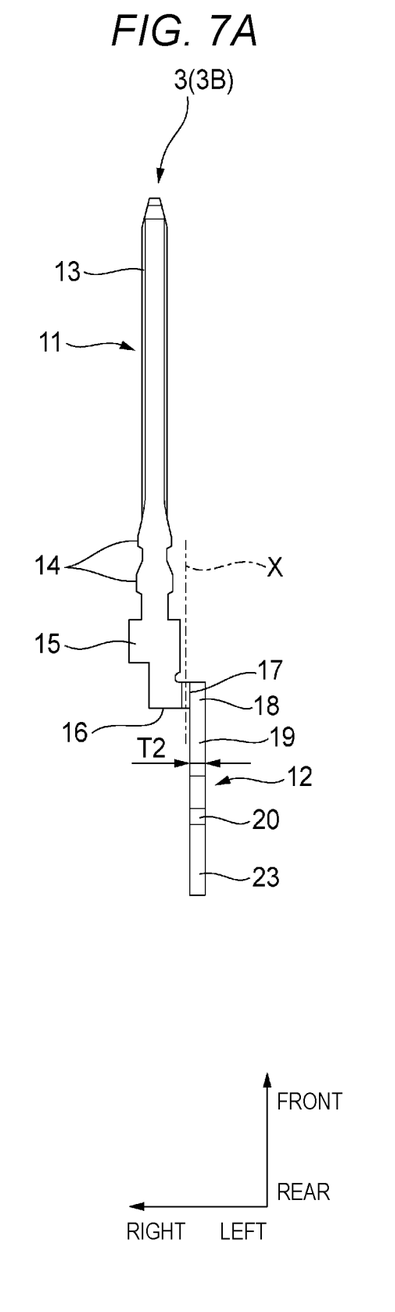
Figure 7B:
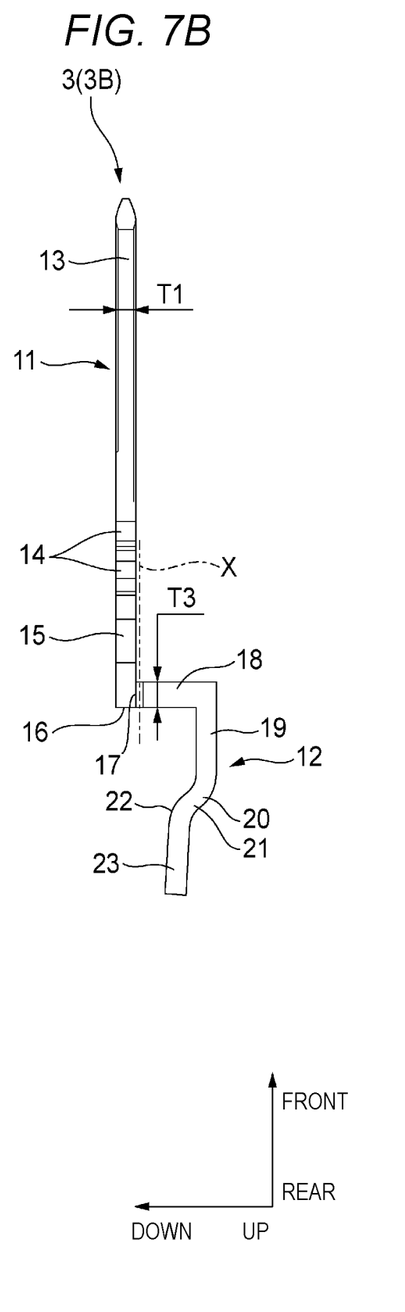

In the lower terminal 3B, the bent portion 17 extends leftward from the rear end portion of the first terminal portion 11, which is contrary to the upper terminal 3 (see FIG. 7A). That is, the bent portion 17 is bent around the bending axis X offset in parallel to a left side from the axis line of the first terminal portion 11. Therefore, in the upper terminal 3A, the second terminal portion 12 is located at a position offset rightward with respect to the first terminal portion 11 (see FIG. 6A), whereas in the lower terminal 3B, the second terminal portion 12 is located at a position offset leftward with respect to the first terminal portion 11 (see FIG. 7A).

In the lower terminal 3B, an overall shape of the second terminal portion 12 is different from that of the upper terminal 3A. Therefore, in the upper terminal 3A, the second contact portion 23 is located at the position offset downward with respect to the first contact portion 13 (see FIG. 6B), whereas in the lower terminal 3B, the second contact portion 23 is located at a position offset upward with respect to the first contact portion 13 (see FIG. 7B). As a result, in a state in which the upper terminals 3A and the lower terminals 3B are respectively press-fitted into the upper press-fitting holes 33A and the lower press-fitting holes 33B of the housing 2, the second contact portions 23 of the upper terminals 3A and the second contact portions 23 of the lower terminals 3B are located on the same plane (see FIG. 4 and the like). The lower terminal 3B has been described above.

Figure 2:
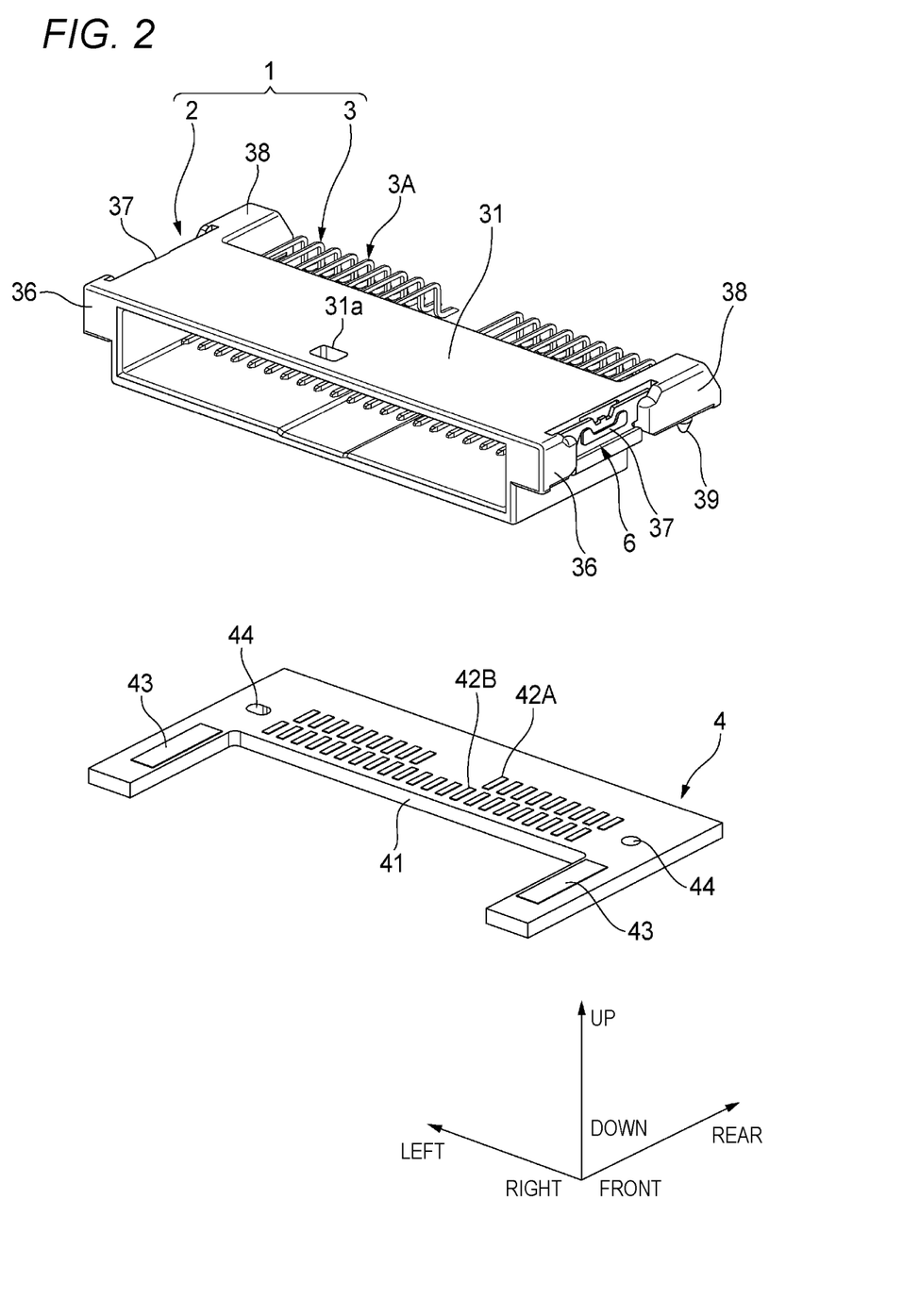
FIG. 2 is a perspective view showing a state in which the connector and the circuit board shown in FIGS. 1A and 1B are separated from each other.

Next, the housing 2 will be described. The housing 2 is a resin molded product, and as shown in FIG. 2 and the like, includes a rectangular tubular main body portion 31 that extends in the front-rear direction and is long in the left-right direction. A rear end of the main body portion 31 is closed by a rectangular flat plate-shaped rear end wall 32 (see FIGS. 4 and 5), and a front end of the main body portion 31 is open. When the connector 1 and the counterpart connector are fitted to each other, the counterpart connector is inserted and fitted into an internal space of the main body portion 31 through the front end opening of the main body portion 31, and is maintained in the fitted state by a lock portion 31a provided at a central portion of an upper wall in the left-right direction of the main body portion 31.

Figure 3A:
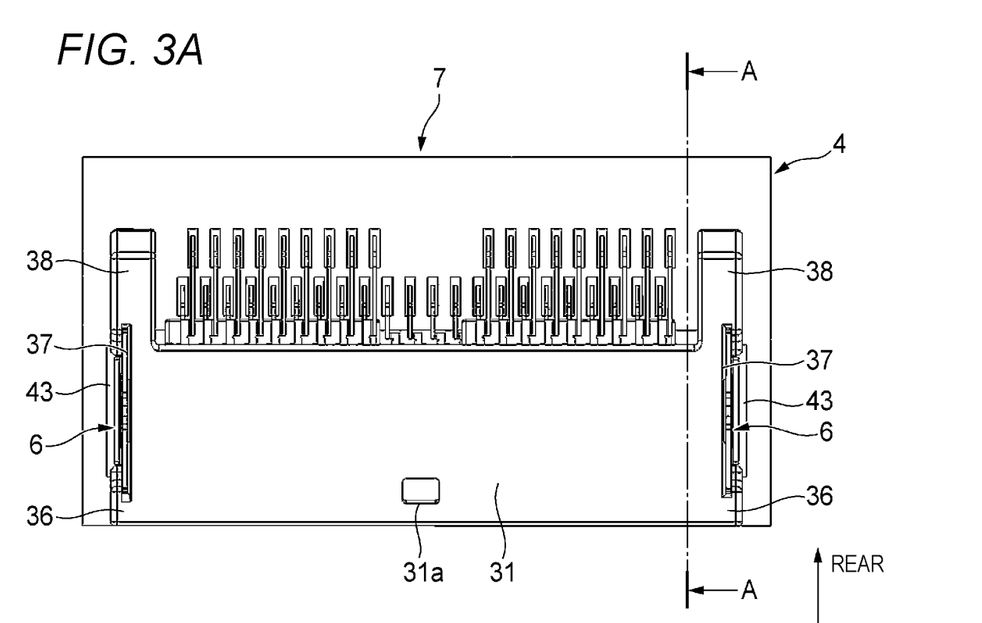
Figure 3B:
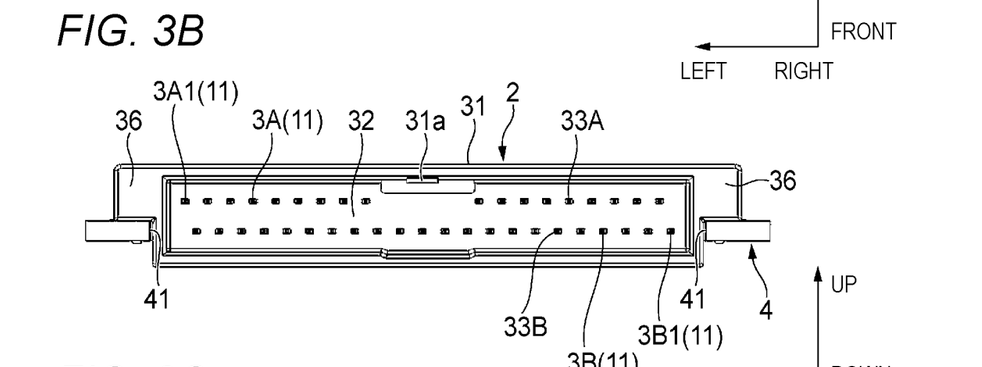
Figure 3C:
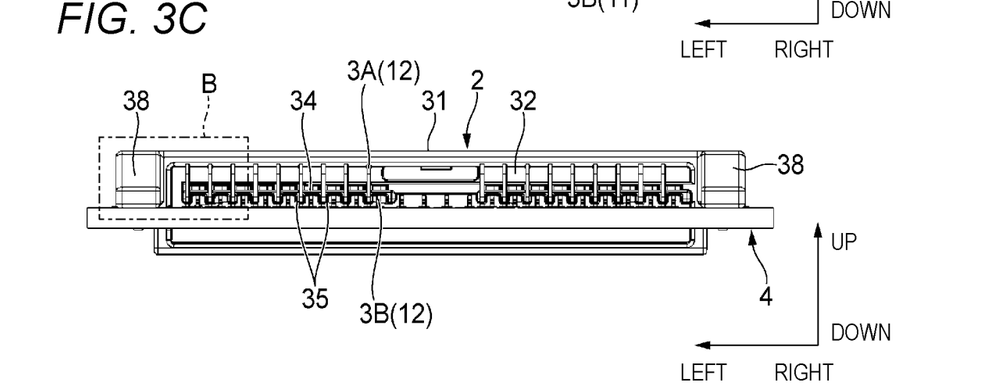

As shown in FIG. 3C, FIG. 5, and the like, the rear end wall 32 is provided with the plurality of upper press-fitting holes 33A disposed in the left-right direction, and is provided with the plurality of lower press-fitting holes 33B disposed in the left-right direction at positions below the plurality of upper press-fitting holes 33A. Each of the upper press-fitting holes 33A and the lower press-fitting holes 33B is a through hole having a rectangular cross section and penetrating in the front-rear direction.

The first terminal portions 11 of the upper terminals 3A are inserted into and press-fitted into the upper press-fitting holes 33A from behind. The press-fitting is performed by pressing the first terminal portions 11 forward by the press-fitting jig (not shown) pressed against the pressing surfaces 16. The press-fitting proceeds while sliding the press-fitting projections 14 of the first terminal portions 11 against inner wall surfaces of the upper press-fitting holes 33A, and is completed when the wide portions 15 of the first terminal portions 11 come into contact with the rear end edges of the upper press-fitting holes 33A. Similarly, the first terminal portions 11 of the lower terminals 3B are inserted into and press-fitted into the lower press-fitting holes 33B from behind.

Figure 4:
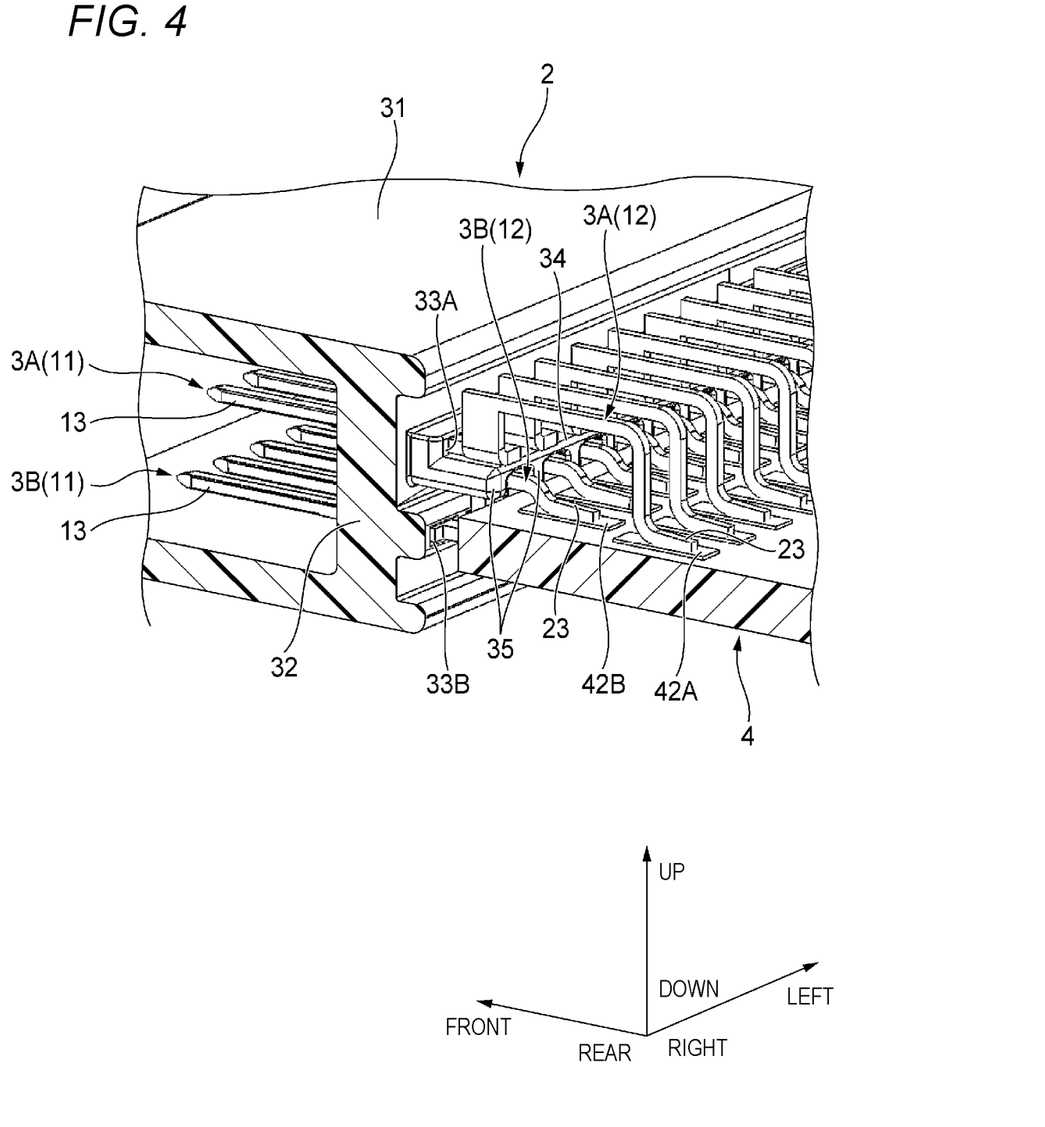
FIG. 4 is a perspective view showing a cross section taken along a line A-A of FIG. 3A.

As shown in FIG. 4, in the press-fit completion state, the first contact portions 13 of the first terminal portions 11 of the upper terminals 3A and the lower terminals 3B are located in the internal space of the main body portion 31, and the second terminal portions 12 of the upper terminals 3A and the lower terminals 3B extend rearward from the rear end wall 32 of the main body portion 31, and the second contact portions 23 are exposed to an outside of the main body portion 31. The second contact portions 23 of the plurality of upper terminals 3A are disposed side by side in the left-right direction, and the second contact portions 23 of the plurality of lower terminals 3B are disposed side by side in the left-right direction at front positions of the second contact portions 23 of the upper terminals 3A. The second contact portions 23 of the plurality of upper terminals 3A and the plurality of lower terminals 3B are all located on the same plane. The second contact portions 23 of the plurality of upper terminals 3A are connected to the conductor patterns 42A of the circuit board 4, and the second contact portions 23 of the plurality of lower terminals 3B are connected to the conductor patterns 42B of the circuit board 4.

An interval (pitch) in the left-right direction between the adjacent upper press-fitting holes 33A and an interval (pitch) in the left-right direction between the adjacent lower press-fitting holes 33B coincide with each other. In the present example, as can be understood from FIG. 3B, the plurality of upper press-fitting holes 33A are disposed to be shifted to the left side by a half pitch with respect to the plurality of lower press-fitting holes 33B. In other words, the plurality of upper press-fitting holes 33A and the plurality of lower press-fitting holes 33B are disposed so as to have a positional relationship (a so-called zigzag shape or a zigzag shape) in which the upper press-fitting holes 33A and the lower press-fitting holes 33B do not overlap each other in the up-down direction when viewed in the front-rear direction.

Therefore, the first terminal portion 11 of a lower terminal 3B1 (see FIGS. 3B and 10) press-fitted into the rightmost lower press-fitting hole 33B among the plurality of lower press-fitting holes 33B is located on a right side of the first terminal portion 11 of the upper terminal 3A press-fitted into the rightmost upper press-fitting hole 33A among the plurality of upper press-fitting holes 33A. Conversely, the first terminal portion 11 of an upper terminal 3A1 (see FIGS. 3B and 10) press-fitted into the leftmost upper press-fitting hole 33A among the plurality of upper press-fitting holes 33A is located on a left side of the first terminal portion 11 of the lower terminal 3B press-fitted into the leftmost lower press-fitting hole 33B among the plurality of lower press-fitting holes 33B. In the present example, in order to avoid interference with the lock portion 31a, the upper press-fitting hole 33A is not provided in the central region in the left-right direction (see FIG. 3B). Accordingly, a height reduction of the main body portion 31 can be further promoted.

Further, for each of the upper terminals 3A and the lower terminals 3B, an offset amount in the left-right direction between the first terminal portion 11 and the second terminal portion 12 is equal to the half pitch. Therefore, as shown in FIG. 10, regarding the lower terminals 3B in which the first terminal portions 11 are press-fitted into the lower press-fitting holes 33B and the upper terminals 3A in which the first terminal portions 11 are press-fitted into the upper press-fitting holes 33A located on the left side of the lower press-fitting holes 33B by the half pitch, positions of the second terminal portions 12 of the upper terminals 3A and positions of the first terminal portions 11 of the lower terminals 3B coincide with each other in the left-right direction, and positions of the first terminal portions 11 of the upper terminals 3A and positions of the second terminal portions 12 of the lower terminals 3B coincide with each other in the left-right direction.

As shown in FIG. 5 and the like, the rear end wall 32 is provided with a plate-shaped partition wall portion 34 that protrudes rearward and extends in the left-right direction between the plurality of upper press-fitting holes 33A and the plurality of lower press-fitting holes 33B in the up-down direction so as to separate the upper press-fitting holes 33A and the lower press-fitting holes 33B from each other. In this example, an upper face of the partition wall portion 34 is continuous and flush with lower end edges of inner walls of the plurality of upper press-fitting holes 33A. In this way, as compared to a case in which the partition wall portion 34 is not provided, it is possible to increase an insulation distance (in particular, a creepage distance) between the upper terminals 3A press-fitted into the upper press-fitting holes 33A and the lower terminals 3B press-fitted into the lower press-fitting holes 33B by providing the partition wall portion 34.

Figure 10:
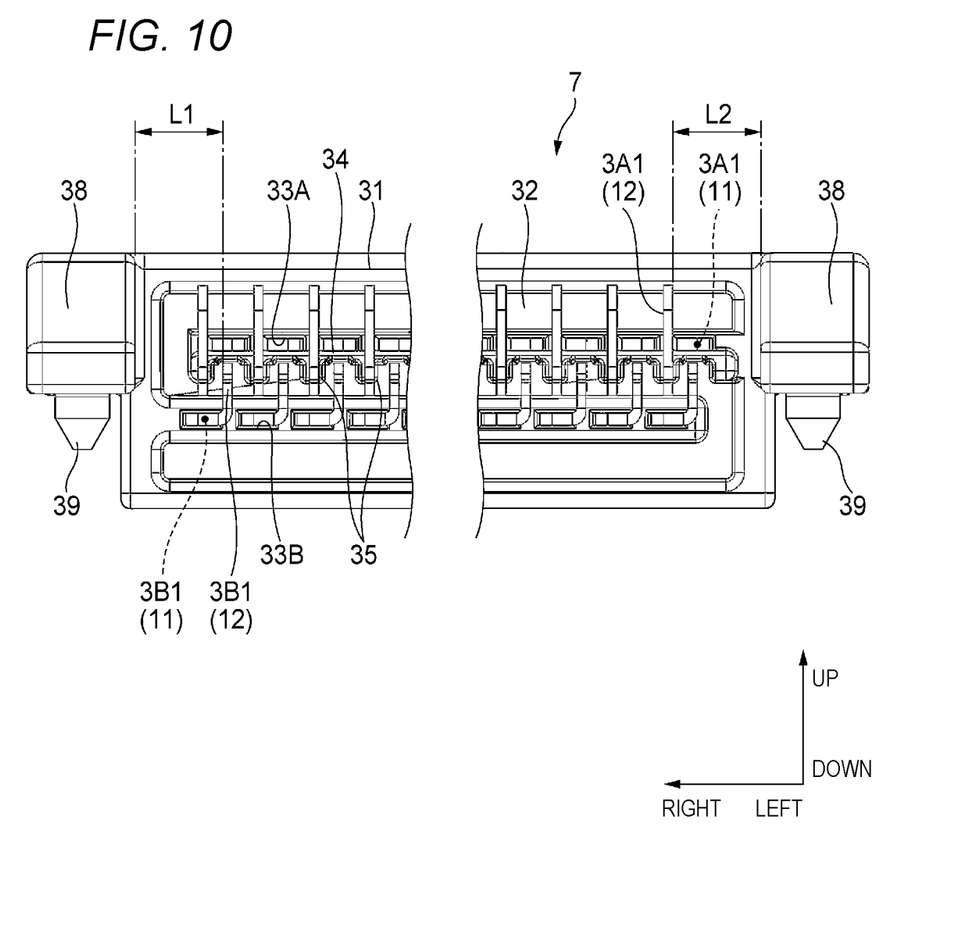
FIG. 10 is a view showing a distance in a left-right direction between protection walls of the housing and second terminal portions of the terminals positioned at both ends in the left-right direction.

Auxiliary wall portions 35 that protrude downward are provided on a lower face of the partition wall portion 34 at respective positions in the left-right direction corresponding to the plurality of lower press-fitting holes 33B (see FIGS. 5, 10 and the like). In other words, each of the auxiliary wall portions 35 is provided between the upper press-fitting holes 33A adjacent to each other in the left-right direction (see FIG. 10). Accordingly, the auxiliary wall portions 35 support partition wall portion 34, and therefore, even when a thickness of the partition wall portion 34 is reduced, the partition wall portion 34 is prevented from collapsing or the like. Further, since the second terminal portion 12 (particularly, the first portion 19) of each of the lower terminals 3B is located in a space between the adjacent auxiliary wall portions 35 (see FIG. 10), an insulation distance between the adjacent lower terminals 3B increases.

As shown in FIG. 2, and the like, a pair of protruding portions 36 are provided in upper regions of both left and right side faces of the main body portion 31 so as to protrude in the left-right direction and extend in the front-rear direction. The pair of protruding portions 36 function as stoppers that define the position in the up-down direction of the housing 2 with respect to the circuit board 4 when the housing 2 is mounted on the circuit board 4. Each of the protruding portions 36 is provided with a peg attachment portion 37, and a metal peg 6 is attached and fixed to each of the peg attachment portions 37.

The main body portion 31 is provided with a pair of protective wall portions 38 so as to continuously protrude further rearward from the pair of protruding portions 36. As a result, the pair of protective wall portions 38 are disposed so as to sandwich, in the left-right direction, the second terminal portions 12 of the plurality of upper terminals 3A and the plurality of lower terminals 3B extending rearward from the plurality of upper press-fitting holes 33A and the lower press-fitting holes 33B, and function to protect the second terminal portions 12 of the plurality of upper terminals 3A and the plurality of lower terminals 3B. As shown in FIGS. 2 and 10, a pair of engaging projections 39 projecting downward are provided on lower faces of the pair of protective wall portions 38. The pair of engaging projections 39 are inserted into a pair of positioning holes 44 (see FIG. 2) of the circuit board 4.

As shown in FIG. 10, in the present example, in the lower terminal 3B1 whose first terminal portion 11 is press-fitted into the rightmost lower press-fitting hole 33B among the plurality of the upper press-fitting holes 33A and the plurality of lower press-fitting holes 33B, the second terminal portion 12 is located on the left side (that is, on an inner side in the left-right direction) of the first terminal portion 11. Similarly, in the upper terminal 3A1 whose first terminal portion 11 is press-fitted into the leftmost upper press-fitting hole 33A among the plurality of upper press-fitting holes 33A and the plurality of lower press-fitting holes 33B, the second terminal portion 12 is located on the right side (that is, on an inner side in the left-right direction) of the first terminal portion 11. Therefore, it is easy to ensure a large distance L1 between the second terminal portion 12 of the lower terminal 3B1 and the right protective wall portion 38 and a large distance L2 between the second terminal portion 12 of the upper terminal 3A1 and the left protective wall portion 38.

In other words, in both the upper press-fitting holes 33A and the lower press-fitting holes 33B, the second terminal portions 12 of the terminals 3 can be disposed at positions separated from the pair of protective wall portions 38 while the first terminal portions 11 of the terminals 3 can be disposed as outward as possible in the left-right direction. Therefore, since it is not necessary to design the pair of protective wall portions 38 to escape outward in the left-right direction in order to avoid contact with the second terminal portions 12, a size of the housing 2 in the arrangement direction (that is, the left-right direction) can be reduced. The housing 2 has been described above.

Next, the circuit board 4 will be described. As shown in FIG. 2, the circuit board 4 made of resin has a rectangular flat plate shape in which a rectangular cut portion 41 is formed in a region excluding both left and right end portions of a front end surface of the circuit board 4. The cut portion 41 has a shape corresponding to an outer shape (a shape viewed from the up-down direction) of the main body portion 31 of the housing 2.

On an upper face of a rear region of the cut portion 41 of the circuit board 4, the plurality of conductor patterns 42A are provided so as to be aligned in the left-right direction corresponding to the second contact portions 23 of the plurality of upper terminals 3A, and the plurality of conductor patterns 42B are provided so as to be aligned in the left-right direction at front positions of the plurality of conductor patterns 42A corresponding to the second contact portions 23 of the plurality of lower terminals 3B.

A pair of recessed portions 43 are provided on an upper face of outer regions of the cut portion 41 of the circuit board 4 in the left-right direction so as to correspond to the pair of pegs 6 fixed to the housing 2. The pair of pegs 6 are accommodated and soldered in the pair of recessed portions 43. The pair of positioning holes (through holes) 44 are provided in an upper surface of an outer region in the left-right direction of the plurality of conductor patterns 42A and 42B of the circuit board 4. The circuit board 4 has been described above.

In order to mount the connector 1 on the circuit board 4, first, as shown in FIG. 2, the housing 2 is disposed above the circuit board 4. Next, the housing 2 and the circuit board 4 are moved closer to each other in the up-down direction until lower faces of the pair of protruding portions 36 come into contact with the circuit board 4 such that the main body portion 31 of the housing 2 is inserted so as to be fitted into the cut portion 41 of the circuit board 4, the pair of pegs 6 are accommodated in the pair of recessed portions 43, the pair of engaging projections 39 are inserted into the pair of positioning holes 44, the second contact portions 23 of the plurality of upper terminals 3A respectively come into contact with the plurality of conductor patterns 42A, and the second contact portions 23 of the plurality of lower terminals 3B respectively come into contact with the plurality of conductor patterns 42B (see FIGS. 1A and 1B).

Next, the pair of pegs 6 accommodated in the pair of recessed portions 43 are bonded and fixed to the pair of recessed portions 43 by an adhesive or solder, the second contact portions 23 of the plurality of upper terminals 3A are fixed to the plurality of conductor patterns 42A by solder, and the second contact portions 23 of the plurality of lower terminals 3B are fixed to the plurality of conductor patterns 42B by solder. Thus, the mounting of the housing 2 on the circuit board 4 is completed. In this way, by mounting the connector 1 so as to be fitted into the cut portion 41 provided in the circuit board 4, a height of an entire structure of the connector 1 and the circuit board 4 can be reduced as compared to a case in which the connector 1 is mounted so as to be placed on a board surface of the circuit board 4.

Functions and Effects

As described above, according to the board mount connector 1 of the present embodiment, the terminal 3 is configured such that the second terminal portions 12 including the second contact portions 23 to be conductively connected to the conductor patterns 42A and 42B of the circuit board 4 include the bent portions 17 extending from the first terminal portions 11 including the first contact portions 13 to be conductively connected to the counterpart terminal and bent around the bending axes along the axis lines of the first terminal portions 11. For example, when the terminals 3 have the typical crank shape, the terminals 3 can be manufactured by punching out the thin metal plate to obtain the preform bodies (for example, see FIGS. 8A and 8B) including the first terminal portions 11 and the second terminal portions 12, and then performing the bending processing once such that the first terminal portions 11 and the second terminal portions 12 are offset from each other in the thickness direction of the circuit board 4. That is, the number of times the bending processing is performed on the terminals 3 can be reduced as compared to the example described above.

Further, in the terminals 3 of the connector 1, since the positions of the bent portions 17 are different from that of the terminals in the related art, and the first contact portions 13 and the second contact portions 23 are offset from each other, terminal surfaces of the first terminal portions 11 can be used as the pressing surfaces 16 of the press-fitting jigs. Therefore, the structure of the terminals 3 can be simplified as compared to a case in which a dedicated pressing surface (for example, a so-called shoulder portion) is separately provided in the terminals 3.

As described above, in the board mount connector 1 according to the present embodiment, even when the first contact portions 13 with the counterpart terminal and the second contact portions 23 with the conductor patterns 42A and 42B of the circuit board 4 are located at offset positions, the number of times the bending processing is performed on the terminals 3 can be reduced, and therefore the connector 1 is excellent in productivity.

Further, regarding to the thickness of the plate-shaped body constituting the terminals 3, the thickness T2 of the second terminal portion 12 is smaller than the thickness T1 of the first terminal portion 11. Therefore, it is easy to perform the bending processing when the bent portions 17 of the second terminal portions 12 are provided.

Further, when the plurality of terminals 3 are disposed in the housing 2, since the thickness of the second terminal portion 12 is reduced in a direction away from the first terminal portion 11 of the adjacent terminal 3, it is possible to increase the interval Y (the so-called insulation distance with reference to FIG. 9A) between a surface of the second terminal portion 12 and s surface of the adjacent terminal 3. In other words, the plurality of terminals 3 can be densely disposed in the housing 2, and a size and height of the connector 1 can be further reduced.

Further, the second terminal portion 12 includes the standing portion 18 extending from the first terminal portion 11 and extending along the intersecting direction through the bent portion 17, the first portion 19 extending from an end portion of the standing portion 18 in the direction along the axis line, and the second portion 21 extending from an end portion of the first portion 19 toward the second contact portion 23. Accordingly, even when the circuit board 4 is disposed at a position offset from the first terminal portions 11 in the intersecting direction, the terminals 3 can be connected to the conductor patterns 42A and 42B of the circuit board 4 while reducing the number of times of the bending processing at the time of manufacturing the terminals 3 as described above.

Further, in a state in which the housing 2 of the connector 1 is disposed so as to be fitted into the cut portion 41 of the circuit board 4, the terminals 3 press-fitted into the housing 2 are connected to the conductor patterns 42A and 42B of the circuit board 4. Accordingly, the overall height of the connector-mounted board 7 can be reduced as compared to the case in which the connector 1 is placed on the board surface of the circuit board 4.

Other Embodiments

The present disclosure is not limited to the above-described embodiment, and various modifications can be used within the scope of the present disclosure. For example, the present disclosure is not limited to the above-described embodiment, and may be appropriately modified, improved or the like. In addition, materials, shapes, dimensions, numbers, arrangement positions, and the like of components in the above-described embodiment are freely set and are not limited as long as the present disclosure can be achieved.

In the embodiment, the upper terminals 3A and the lower terminals 3B are press-fitted into the housing 2. Meanwhile, only one of the upper terminals 3A and the lower terminals 3B may be press-fitted into the housing 2.

Further, in the embodiment described above, regarding to the thickness of the plate-shaped body constituting the terminal 3, the thickness T2 of the second terminal portion 12 is smaller than the thickness T1 of the first terminal portion 11. However, the thickness T2 of the second terminal portion 12 and the thickness T1 of the first terminal portion 11 may be the same.

The board mount connector 1 according to the embodiment of the present disclosure mountable on the circuit board 4 including the conductor pattern 42A, 42B and connectable to the counterpart terminal. The board mount connector 1 includes the housing 2 having the press-fitting hole 33A, 33B, and the terminal 3 press-fitted into the press-fitting hole 33A, 33B. The terminal 3 includes the first terminal portion 11 and the second terminal portion 12. The first terminal portion 11 includes the first contact portion 13 contacting and conductively connected to the counterpart terminal when the first contact portion 13 is connected to the counterpart terminal, and the press-fitting portion 14 that is press-fitted into the press-fitting hole 33A, 33B. The second terminal portion 12 includes the bent portion 17 extending from the first terminal portion 11 and bent around the bending axis X along the axis line of the first terminal portion 11, and the second contact portion 23 located at the position offset from the first contact portion 13 in the intersecting direction intersecting with the axis line of the first terminal portion 11 and conductively connected to the conductor pattern 42A, 42B when the board mount connector 1 is mounted on the circuit board 4.

According to this configuration, the second terminal portion 12 including the second contact portion 23 to be conductively connected to the conductor pattern 42A, 42B of the circuit board 4 includes the bent portion 17 extending from the first terminal portion 11 including the first contact portion 13 to be conductively connected to the counterpart terminal and bent around the bending axes X along the axis line of the first terminal portion 11. The terminal 3 has a shape in which the first contact portion 13 as a contact for the counterpart terminal and the second contact portion 23 as a contact for the conductor pattern 42A, 42B of the circuit board 4 are offset from each other. For example, in the case in which the terminal 3 is produced to have the crank shape as in the related art, after the thin metal plate is punched out to manufacture the preform body 3g (for example, see the chain terminal shown in FIGS. 8A and 8B) including the first terminal portion 11 and the second terminal portion 12, the bending processing may be performed once at the bent portion 17 such that the first contact portions 13 and the second contact portions 23 are offset in a predetermined direction. That is, the number of times the bending processing is performed on the terminal 3 can be reduced as compared to the number of times (at least twice) in the related art. When the terminals 3 has a more complicated shape, for example, a preform body having such a shape may be manufactured at a stage of the punching, or additional bending processing may be performed after the bending processing on the crank shape. In any case, as described above, the number of times of the bending processing can be reduced as compared to the related art.

Further, the position of the bent portion 17 of the terminal 3 is different from that of the terminal in the related art, and the first contact portion 13 and the second contact portion 23 are offset from each other. With this configuration, the terminal surface of the first terminal portion 11 (for example, the end surface of an end portion on an opposite side to the first contact portion 13, see FIGS. 6A, 6B, 7A, and 7B) can be used as the pressing surface 16 of the press-fitting jig. Therefore, the structure of the terminal 3 can be simplified as compared to a case in which the dedicated pressing surface (for example, the so-called shoulder portion) is separately provided in the terminals.

As described above, since the board mount connector 1 can simplify the structure of the terminal 3 and reduce the number of times the bending processing is performed in the manufacturing stage of the terminal 3. Therefore, the board mount connector 1 is excellent in the productivity as compared to the connector in the background art.

Further, the terminal 3 includes the plate-shaped body 3g including and continuously extending over the first terminal portion 11 and the second terminal portion 12 and is bent at the bent portion 17, and the thickness T2 (a second thickness) of the plate-shaped body 3g at the bent portion 17 of the second terminal portion 12 is smaller than the thickness T1 (a first thickness) of the plate-shaped body 3g at the first terminal portion 11.

With this configuration, the terminal 3 is formed of the continuous plate-shaped body 3g, and the thickness T2 of the plate-shaped body 3g at the bent portion 17 of the second terminal portion 12 is smaller than the thickness T1 of the plate-shaped body 3g at the first terminal portion 11. Therefore, since the bent portion 17 of the second terminal portion 12 is thin, the bending processing on the bent portion 17 is facilitated.

The thickness T2 of the plate-shaped body 3g at the bent portion 17 of the second terminal portion 12 decreases toward the second contact portion 23 such that the bent outer surface of the plate-shaped body 3g approaches the bent inner surface of the plate-shaped body 3g.

With this configuration, the plate-shaped body 3g at the bent portion 17 of the second terminal portion 12 has the shape (for example, see FIG. 8B) in which the thickness is reduced such that the bent outer surface approaches the bent inner surface, and thus the plate-shaped body 3g of the second terminal portion 12 is thinner than the plate-shaped body 3g of the first terminal portion 11. Accordingly, for example, when the plurality of terminals 3 are disposed side by side in the housing 2, as described above, the distance (so-called insulation distance) between the bent portion 17 and the adjacent terminal 3 can be increased since the thickness of the bent portion 17 is reduced. In other words, the plurality of terminals 3 can be densely disposed in the housing 2, and the size and height of the connector 1 can be further reduced. Not only the bent portion 17 but also the entire second terminal portion 12 may be thinner than the first terminal portion 11.

The second terminal portion 12 includes the standing portion 18 extending from the first terminal portion 11 and extending along the intersecting direction through the bent portion 17, the first portion 19 extending from the end portion of the standing portion 18 in the direction along the axis line, and the second portion 21 extending from the end portion of the first portion 19 toward the second contact portion 23.

With this configuration, the second terminal portion 12 of the terminal 3 includes the standing portion 18 extending from the first terminal portion 11 and extending along the intersecting direction through the bent portion 17, the first portion 19 extending from the end portion of the standing portion 18 in the direction along the axis line, and the second portion 21 extending from the end portion of the first portion 19 toward the second contact portion 23. Accordingly, for example, even when the circuit board 4 is disposed at the position offset from the first terminal portions 11 in the intersecting direction (for example, see FIG. 4), the terminals 3 can be connected to the conductor patterns 42A and 42B of the circuit board 4 while reducing the number of times of the bending processing at the time of manufacturing the terminals as described above.

The connector-mounted board 7 according to the embodiment of the present disclosure includes the circuit board 4, and the board mount connector 1 mounted on the circuit board 4. The circuit board 4 includes the cut portion 41 defined by the side edge of the circuit board 4 that is recessed in the direction along the board surface, the board mount connector 1 is disposed such that the housing 2 is fitted into the cut portion 41, and the second terminal portion 12 is conductively connected to the conductor pattern 42A, 42B of the circuit board 4.

With this configuration, in a state in which the housing 2 of the connector 1 is disposed so as to be fitted into the recess-shaped cut portion 41 of the circuit board 4, the terminal 3 press-fitted into the housing 2 is connected to the conductor pattern 42A, 42B of the circuit board 4. Accordingly, the overall height of the connector-mounted board 7 can be reduced as compared to the case in which the connector is placed on the board surface of the circuit board so as to mount the connector. Further, as described above, since the structure of the terminal 3 can be simplified and the number of times the bending processing is performed in the manufacturing stage of the terminal 3 can be reduced, the productivity of the connector 1 (and the productivity of the connector-mounted board 7) can be improved.

In this way, according to the embodiment of the present disclosure, a board mount connector excellent in productivity and a connector-mounted board using the connector can be provided

The invention claimed is:

1. A board mount connector mountable on a circuit board having a conductor pattern and connectable to a counterpart terminal, the board mount connector comprising:
 a housing having a press-fitting hole; and
 a terminal press-fitted into the press-fitting hole,
 wherein the terminal comprises:
  a first terminal portion; and
  a second terminal portion,
 wherein the first terminal portion comprises:
  a first contact portion contacting and conductively connected to the counterpart terminal when the first contact portion is connected to the counterpart terminal; and
  a press-fitting portion that is press-fitted into the press-fitting hole, and wherein the second terminal portion comprises:
  a bent portion extending from the first terminal portion and bent around a bending axis along an axis line of the first terminal portion; and
  a second contact portion located at a position offset from the first contact portion in an intersecting direction intersecting the axis line of the first terminal portion and conductively connected to the conductor pattern when the board mount connector is mounted on the circuit board,
 wherein the terminal comprises a plate-shaped body comprising and continuously extending over the first terminal portion and the second terminal portion, the plate-shaped body being bent at the bent portion,
 wherein a second thickness of the plate-shaped body at the bent portion of the second terminal portion is smaller than a first thickness of the plate-shaped body at the first terminal portion, and
 wherein the second thickness of the plate-shaped body at the bent portion of the second terminal portion decreases toward the second contact portion such that a bent outer surface of the plate-shaped body approaches a bent inner surface of the plate-shaped body.

2. The board mount connector according to claim 1, wherein the second terminal portion comprises:
 a standing portion extending from the first terminal portion and extending along the intersecting direction through the bent portion;
 a first portion extending in a direction along the axis line from an end portion of the standing portion; and
 a second portion extending from an end portion of the first portion toward the second contact portion.

3. A connector-mounted board comprising:
 a circuit board; and
 the board mount connector according to claim 1, the board mount connector being mounted on the circuit board,
 wherein the circuit board has a cut portion defined by a side edge of the circuit board that is recessed in a direction along a board surface, and
 wherein the board mount connector is disposed such that the housing is fitted into the cut portion, and the second terminal portion is conductively connected to the conductor pattern of the circuit board.

\* \* \* \* \*